United States Patent Office 3,625,696
Patented Dec. 7, 1971

3,625,696

PRODUCTION OF PRINTING PLATES

Carl Heinrich Krauch, Heidelberg, and Hans-Werner Otto, Ludwigshafen, Germany, assignors to Badische Anilin- & Soda-Fabrik Aktiengesellschaft, Ludwigshafen (Rhine), Germany No Drawing. Filed Oct. 28, 1968, Ser. No. 771,312
Claims priority, application Germany, Oct. 27, 1967, P 15 97 748.7
Int. Cl. G03c *1/68, 1/74*
U.S. Cl. 96—86 P 7 Claims

ABSTRACT OF THE DISCLOSURE

The invention relates to plates, sheets or films applied to a highly reflective material, and which are used to prepart printing plates, said plates, sheets or films being formed from a mixture containing an indigoid dye and consisting of a polymeric base material, monomers having at least two polymerizable double bonds, photoinitiators and/or polymerization inhibitors.

This invention relates to a process for the production of printing plates in which plates or sheets of a polymeric base material which contains photopolymerizable unsaturated compounds, indigoid dyes, photoinitiators and/or inhibitors, are applied to a support provided with a light reflecting layer and are exposed through an image-bearing transparency and then washed out at the unexposed areas by means of solvents down to the desired depth.

It is already known that printing plates can be prepared by exposing through an image-bearing transparency a plate or sheet of a mixture of a highly polymerized substance with an unsaturated monomer containing more than one polymerizable double bond and a photoinitiator and removing the unexposed areas by means of a suitable solvent down to the desired depth. These plates are suitable for letterpress and dry offset printing.

It is also known that plates or sheets of linear saturated synthetic polyamides, monomers having at least two double bonds and photoinitiators can be used for the production of printing plates.

To prepared plates having the mechanical stability required for printing, photosensitive films or sheets of polymerizable monomers and highly polymerized substances have already been applied to a support, particularly metal plates. Metal plates according to British patent specification No. 741,294 are provided with an antireflective coating to prevent light reflected by the base from initiating an unwanted polymerisation reaction in the photosensitive layer.

In the production of printing plates particular importance is attached to the shape of the shoulders. The difficulties encountered in the case of conventional photopolymerisation in the production of steep shoulders are dealt with at length for example in U.S. patent specification No. 2,760,863. Photosensitive film or sheet laminated to metal plates accordingly gives, in the production of printing plates, broadened shoulders as well as supporting bases of polymer which are much too wide because light reflected at the metal plate, as already mentioned, also initiates polymerization reactions within areas of the photosensitive plates covered by the portions of the image-bearing transparency which are opaque. For this reason the application of a colored lacquer which absorbs incident light to the metal plate serving as base is recommended in the above-mentioned U.S. patent specification.

Even this does not solve the problem of providing the shoulders and supporting bases of polymer of the printing relief with a favorable shape. Naturally the area of the photosensitive layer exposed to the light source is first impinged upon by all the light quanta emitted, the stream of quanta decreasing downwardly within the layer corresponding to their extinction coefficients. This means that the photopolymer layer is cured best at its surface while the material in the lower layers of the plate remains to certain extent soluble even at the exposed areas. In the following development process in which areas which have not been photopolymerized are washed out, undercutting of the supporting bases of polymer readily takes place so that their rigidity suffers.

To remedy this defect U.S. patent specification No. 2,964,401 describes the production of photopolymerizable layers consisting of a plurality of thin films which differ in the concentration of the photoinitiator. The layers farthest from the incident light contain the highest concentration of photoinitiator in order that satisfactory curing may be achieved at the exposed areas. Photo polymerizable plates of this type have however not proved to be very suitable in practice for the production of printing plates. The application of the different layers of unusually complicated as regards the tolerance on thickness required for printing plates. Moreover, the mechanical properties of printing plates made from the said plates are unsatisfactory and this becomes evident for example in separation of the individual layers when such plates are used for printing.

We have now found that printing plates which do not exhibit the said disadvantages can be prepared by exposure, under an image-bearing transparency followed by washing out the unexposed areas with a solvent to the desired depth, of plates, sheets or films of a mixture of a polymeric base material, photopolymerizable unsaturated compounds, photoinitiators and/or inhibitors which is applied to a permanent base, by using for the preparation of the plate, sheet or film a mixture which also contains an indigoid dye and by using as the base a material which is highly reflective.

All synthetic polymers which are suitable for the preparation of printing plates may be used as the polymeric base material for the production of the plate, sheet or film. For example the substances set out in U.S. patent specification No. 2,760,863 are suitable, such as polyvinyl resins, for example polyvinyl chloride and polyvinylidene chloride as well as copolymers of vinyl chloride and vinyl alcohol, polymers of vinyl carboxylates in which the vinyl group is present in the acid function, such as acrylic acid and derivatives and esters thereof. Polystyrene and polymers of vinyl esters, such as vinyl acetate and vinyl chloroacetate, diesters of acrylic and methacrylic acids with glycols or higher polyfunctional alcohols, such as ethylene glycol, 1,4-butanediol or glycerol, alkyd resins from such alcohols and polybasic acids and cellulose derivatives may also be used.

Linear polyamides containing recurrent $$-\underset{\underset{O}{\|}}{C}-\underset{\underset{H}{|}}{N}-$$

groups in the main chain of the molecule are particularly suitable polymers.

Copolyamides which are soluble in conventional solvents or solvent mixtures, such as lower aliphatic alcohols or mixtures of alcohol and water, ketones, aromatics or mixtures of benzene, alcohol and water are particularly suitable. Examples of these are copolyamides which have been prepared by a conventional method by polycondensation or activated anionic polymerisation from two or more lactams having five to thirteen ring members. Examples of such lactams are pyrrolidone, caprolactam, enantholactam, capryllactam, laurolactam or equivalent carbon-substituted lactams such as C-methyl-epsilon-caprolactam, epsilon-ethyl-epsilon-capro-lactam or α-ethylenantholactam. The aminocarboxylic acids on which the lactams are based may be polycondensed instead of the lactams.

Further suitable polyamides are polycondensation products of salts of the diamine/dicarboxylic acid type which have been prepared from at least three polyamide-forming starting materials. Examples of conventional dicarboxylic acid and diamines for the purpose are adipic acid, suberic acid, sebacic acid, dodecane-dicarboxylic acid and corresponding substitution products, such as α,α-diethyladipic acid, α-ethylsuberic acid, octanedicarboxylic acid, heptadecanedicarboxylic acid-(1,8) or heptadecanedicarboxylic acid-(1,9) or mixture of the same as well as dicarboxylic acids containing aliphatic or aromatic ring systems. The diamines used may be compounds such as pentamethylenediamine, hexamethylenediamine, heptamethylenediamine, octamethylenediamine or carbon-substituted or nitrogen-substituted derivatives of these amines, such as N-methyl-N-ethylhexamethylenediamine, 1,6-diamino-4-methylhexane, cycloaliphatic or aromatic diamines, such as metaphenylenediamine, metaxylylenediamine, 4,4′-diaminodiphenylmethane, and the bridging groups between the two carboxylic acid groups and amino groups may be interrupted by heteroatoms. Particularly suitable copolyamides are those which have been prepared by cocondensation of a mixture of one or more lactams and at least one salt of a dicarboxylic acid and a diamine, for example of epsilon-caprolactam, hexamethylendiammonium adipate and 4,4′-diaminodicyclohexalmethane adipate.

Examples of suitable monomers which contain at least two polymerisable olefinically unsaturated double bonds are those which contain amide groups besides the double bonds, such as methylene-bisacrylamine, methylenebismethacrylamide and the bisacrylamides or bismethacrylamides of ethylenediamine, propylenediamine, butylenediamine, pentamethylenediamine, hexamethylenediamine, heptamethylenediamine, octamethylenediamine, and of polyamides and other diamines which are branched, which are interrupted by heteroatoms or which contain cyclic systems. Monomers which contain urethane or urea groups in addition to amide groups are also very suitable, such as the reaction products of diol monoacrylates or monomethacrylates with diisocyanates or the equivalent reaction products of monoacrylamides of a low molecular weight or monomethacrylamides diamine with a diisocyanate. Among monomers containing nitrogen the following are suitable: tri-acrylic formal (=1,3,5-triacrylaylhexahydro-1,3,5-triazine) or triallyl cyanurate. Diacrylates, dimethacrylates, triacrylates, trimethacrylates, tetraacrylates or tetramethacrylates of dihydric or polyhydric alcohols are also suitable. The use of bifunctional or polyfunctional polymerizable monomers is however not limited to the choice given above. It also includes other monomers having at least two polymerizable double bonds provided these are compatible to the extent of at least 20 to 50% with the said copolyamides; this can be established easily by simple small-scale. Moreover, up to 10% by weight of monomers having at least two double bonds may be replaced in a conventional manner by monomers having only one polymerizable olefinic double bond, such as styrene, maleic anhydride, esters of acrylic or methacrylic acid with alaknols having 1 to 6 carbon atoms, acrylamide, methacrylamide, methylolacrylamide and methylolmethacrylamide.

Examples of suitable photoinitiators are compounds which decompose into radicals under the action of light and start polymerization, for example vicinal ketaldonyl compounds, such as diacetyl, benzil; α-ketaldonyl alcohols, such as benzoin; acyloin ethers, such as benzoin methyl ether; α-substituted aroamtic acyloins, such as α-methylbenzoin. The photoinitiators are used in amounts of from 0.01 to 10%, preferably 0.01 to 3%, by weight with reference to the whole mixture.

Examples of conventional thermal polymerization inhibitors are hydroquinone, p-methoxyphenol, p-quinone, copper(I) chloride, methylene blue, β-naphthylamine, β-naphthol, phenols and the like. Salts of N-nitrosocyclohexylhydroxylamine, for example the cerium(III) salt or the cyclohexylammonium salt of N-nitrosocyclohexylamine, are particularly suitable. The polymerization inhibitors are added in amounts of from 0.01 to 5.0%, preferably from 0.05 to 3.0%, by weight with reference to the amount of monomers in the whole mixture.

Indigoid dyes in accordance with this invention include all dyes having the fundamental structure of indigo, particularly indigo, 4,4′-dichloroindigo, 5,5′-dibromoindigo, 5,5′,7,7′ - tetrachloroindigo, 5,5′,7,7′ - tetrabromoindigo, 4,4′-dichloro-5,5′-dibromoindigo, thioindigo and salts of indigosulfonic acids, particularly the disodium salt of 5,5′-indigodisulfonic acid.

The dye added depends on its extinction coefficient. The amount added is within the range from 0.0001 to 5.0%, preferably from 0.01 to 1.0%, by weight with reference to the weight of the photopolymerizable layer. If the dye has an absorption gap in the range of absorption of the photopolymerization initiators present in the layer, more dye may be added.

Examples of suitable support materials are wood, special paper materials, plastics sheeting or film or wooden or paper supports laminated with plastics sheeting or film, metal foils or wooden, paper or plastics sheets laminated therewith, plates or sheets of plastics reinforced with glass fibers or wire, textile fabrics laminated with plastics or metal foil, sheets of glass unlaminated or laminated as above, sheet metal of all types and particularly materials which have been roughened electrolytically or mechanically.

The highly reflective layer to be applied to the base may consist of small highly reflective pellets, transparent materials or materials having a metallic lustre. The layer may be a polished or roughened metal surface or metal dust embedded in plastics sheeting. It is advantageous to use paint pigmented with conventional white pigments (titanium dioxide, zinc oxide, magnesium oxide and the like). The paint may be one which dries physically or one which cures chemically. Highly reflective layers to be used according to the invention are those which reflect incident light to the extent of at least 38%, preferably to the extent of more than 50%.

The plates, films or sheets which contain indigoid dyes in accordance with this invention may be prepared by conventional methods, for example by dissolving the components, removing the solvent, followed by pressing, extrusion or rolling of the finely divided mixture. The solutions of the components may also be cast into sheets of films. The indigoid dyes are preferably added to the solutions of the components prior to the processing of the same into a photosensitive layers. The indigoid dyes may however be added at a later time to the finished mixture immediately prior to the production of the photosensitive layers. In any case care should be taken that the dye is homogeneously distributed.

High-energy lamps, such as carbon arc lamps, mercury vapor lamps, xenon lamps or fluorescent tubes are used for exposure.

EXAMPLE 1

0.001, 0.01, 0.05 and 0.1 part of the disodium salt of 5,5′-indigodisulfonic acid is added to a solution of 100 parts of a polyamide which is soluble in aqueous alcohol, 15 parts of m-xylylenebisacrylamide, 11 parts of triethylene glycol bisacrylamide, 28 parts of the glycol ether of methylolacrylamide, 13 parts of methoxymethylmethacrylamide, 1 part of benzoin methyl ether and 0.1 part of the cyclohexylammonium salt of N-nitrosocyclohexylhydroxylamine. The solutions are cast into films, dried and pressed onto base plates which have been painted white. The paint is a polyurethane paint filled with titanium dioxide.

The finished plates are exposed for fifteen minutes in contact with a negative. After the lapse of five to ten minutes the disodium salt of 5,5′-indigodisulfonic acid is selectively bleached out in the areas upon which the light has impinged. The light source used is a fluorescent tube emitting a high proportion of ultraviolet light which is situated at a distance of 3 cm. from the plate to be exposed. After exposure, the unexposed areas of the plate are dissolved out with a mixture of 63% of ethanol, 21% of propanol and 16% of water. The printing plates obtained after drying exhibit a sharp relief image and have the stabilities desired for printing.

Equivalent results are obtained when the polyunsaturated monomers specified above are partially or wholly replaced by the following monomers: hexamethylenediaminebisacrylate, triacrylic formal and up to 10 parts of methylenebisacrylamide. Particularly good plates are obtained when the glycol ether of methylolamide is used as the sole bifunctional monomer in 30–35 parts of the said formulation.

EXAMPLE 2

The following are dissolved successively at 20° to 30° C. in 12,700 g. of methanol:

71 g. of the cyclohexylammonum salt of N-nitrosocyclohexylamine, 2,372 g. of water, 26,910 g. of a solution containing 20% of m-xylylenebisacrylamide, 11.5% of water and 68.83% of methanol, 2,118 g. of triethylene glycol bisacrylamide, 29,080 g. of a methanol solution containing 20.02% of bis-N-methylolacrylamide diethyl glycol ether and 0.4% of water, 23,296 g. of a copolyamide which is soluble in aqueous alcohols. After the polyamide has been added the whole is stirred for six hours at 60° to 65° C. and then 265 g. of benzoin methyl ether and 20 g. of indigo are added. After pressure filtration, the solution is concentrated in a flash evaporator and cast into a film onto a base plate having a metallic lustre or, as described in Example 1, onto a support which has been painted white. Exposure and development as described in Example 1 give printing plates with a sharp relief image which have a particularly good character shape.

EXAMPLE 3

The procedure of Example 2 is followed but 24 g. of the disodium salt of 5,5′-indigodisulfonic acid is used instead of indigo. The plates thus prepared have a particularly good exposure margin and the printing reliefs obtained have a good character shape.

Plates prepared according to Examples 1 to 3 but without the addition of indigoid dyes yield, upon exposure on highly reflective bases and development by washing out, completely useless printing reliefs which exhibit in particular extensive crosslinking of the unexposed areas.

EXAMPLES 4 to 12

230 parts of a mixture of 88 parts of a soluble copolyamide prepared by polycondensation of equal parts of caprolactam, the salt of hexamethylenediamine and adipic acid and the salt of 4,4′-diaminodicyclohexylmethane and adipic acid, 12 parts of ethylene glycol, 20 parts of m-xylylenebisacrylamide, 8 parts of triethylene glycol diacrylate, 22 parts of bis-N-methylolacrylamide diethyl glycol ether, 1 part of benzoin methyl ether, 0.3 part of cyclohexylammonum salt of N-nitrosocyclohexylhydroxylamine and 0.12 part of the disodium salt of indigodisulfonic acid are dissolved at 60° C. in a mixture (9:1) of methanol and water. The solution is clarified by filtration and cast into sheeting having a thickness of 0.77 mm. and a residual content of solvent of about 10%. This photopolymer sheeting is laminated onto supports having various colors.

The reflective power of the supports is measured with a Universal reflectometer (calibrated against a Standard White and Standard Black sheet) at both of the wavelengths given in the table. The reflection values are given in the following table in which No.=Example No.; and 420 and 460=reflectance in percent at a wavelength of 420 and 460 millimicrons respectively.

TABLE

| No. | Color of backing | 420 | 460 |
|---|---|---|---|
| 4 | Aluminum sheet, rolled matt | 64.7 | 64.7 |
| 5 | Sheet iron painted white as in Example 1 | 71.8 | 80.6 |
| 6 | Sheet iron painted green * | 42.6 | 38.8 |
| 7 | do | 49.3 | 57.7 |
| 8 | do * | 55.2 | 56 2 |
| 9 | Sheet iron painted light blue * | 45.4 | 63.0 |
| 10 | do * | 58.2 | 67.0 |
| 11 | do * | 67.0 | 75.1 |
| 12 | Sheet iron painted light yellow | 45.4 | 63 |

*In Examples 6 to 11 urethane paint is used which is adjusted to the various reflectances by incorporating white pigments.

After exposure and development as described in Example 1, printing plates are obtained which are distinguished by particularly good character shape. The resultant printing plates have a minimum exposure time of from four to ten minutes; the minimum exposure time is that exposure time after which a line having a thickness of 0.05 mm. is reproduced in relief smoothly and without undulations.

If the abovementioned photopolymer sheeting (which however has not had indigoid dye added to it) is applied to the reflecting supports specified in Examples 4 to 12, a printing relief entirely lacking image sharpness is obtained after exposure and development.

EXAMPLE 13

20 parts of a polyester resin (prepared by a conventional method from 2 moles of maleic anhydride, 1 mole of phthalic anhydride and 3 moles of propylene glycol) is mixed with 10 parts of styrene and then 0.15 part of benzoin methyl ether and 0.02 part of 5,5′-dibromoindigo are added. This mixture is cast onto a metallized polyester sheeting serving as base. Exposure through a negative as in Example 1 followed by washing out of the unexposed areas with acetone at room temperature gives a hard relief having good image sharpness which can be used for printing.

EXAMPLE 14

22 and 15 parts of bis-N-methlolacrylamide diethyl glycol ether, 5 parts of methylenebisacrylamide and 1 part of benzoin methyl ether, 0.3 part of cyclohexylammonium salt of N-nitrosylhexylhydroxylamine and 0.15 part of the disodium salt of 5,5′-indigosulfonic acid are added to a solution of 88 parts of a copolyamide (prepared by conventional polycondensation of equal parts of the salt of hexamethylenediamine and adipic acid, the salt of 4,4-diaminodicyclohexylmethane and adipic acid and caprolactam) in 230 parts of a mixture of 90 parts of methanol and 10 parts of water. After further processing as described in Example 1, a printing plate having excellent image sharpness is obtained with an exposure time of only twelve minutes in each case.

If the monomers contained in the mixture described in Example 14 are replaced by 15 parts of bis-N-methylolacrylamide diethyl glycol ether and 10 parts of diacrylamide dimethyl ether, printing plates are obtained under the conditions described in Example 1 which have a sharp relief image and a good character shape.

EXAMPLE 15

27, 22, 20 or 15 parts of bis-N-methylolacrylamide diethyl glycol ether, 1 part of benzoin methyl ether, 0.3 part of cyclohexylammonium salt of N-nitrosocyclohexylhydroxylamine and 0.025, 0.04, 0.05 or 0.15 part of the disodium salt of 5,5′-indigodisulfonic acid are incorporated in the solution described in Example 14.

After further processing as described in Example 1, printing plates are obtained having great image sharpness and extremely good stability in storage.

If half of the bis-N-methylolacrylamide diethyl glycol ether is replaced by hexamethylenebisacrylate, printing plates are obtained having equally good properties.

If addition of the disodium salt of 5,5'-indigodisulfonic acid is omitted, plates unsuitable for printing are obtained in every case.

We claim:

1. A plate for producing relief printing plates which comprises:

(a) a photopolymerizable layer comprising a mixture of (1) a synthetic polymer;

(2) a photopolymerizable monomer having at least two polymerizable olefinic double bonds;

(3) 0.01 to 10% by weight, with reference to the mixture of a photoinitiator; and (4) 0.001 to 5.0% by weight based on the weight of said mixture of an indigoid dye homogeneously dispersed in said mixture; and (b) a support for said layer, said support having a surface which reflects incident light to the extent of at least 38%.

2. A plate as in claim 1 wherein the surface of said support reflects incident light to the extent of at least 50%.

3. A plate as in claim 1 wherein said synthetic polymers is a polyamide.

4. A plate as in claim 1 wherein said synthetic polymer is a polyester.

5. A plate as in claim 1 wherein a plastic sheet provided with a reflective layer is used as a support.

6. A process as in claim 1 wherein a polished metal sheet is used as the support.

7. A process as in claim 1 wherein the indigoid dye is present in the amount of 0.01 to 1.0% by weight with reference to the weight of said mixture.

References Cited

UNITED STATES PATENTS

| | | | |
|---|---|---|---|
| 2,760,863 | 8/1956 | Plambeck | 96—84 |
| 2,964,401 | 12/1960 | Plambeck | 96—35.1 |
| 2,993,789 | 7/1951 | Crawford | 96—35.1 |
| 3,060,025 | 10/1962 | Burg et al. | 96—115 |
| 3,070,442 | 12/1962 | Cohen et al. | 96—35.1 |
| 3,099,558 | 7/1963 | Levinos | 96—115 |
| 3,218,167 | 11/1965 | Burg et al. | 96—35.1 |

FOREIGN PATENTS

| | | | |
|---|---|---|---|
| 567,014 | 12/1958 | Canada | 96—115 |
| 756,547 | 4/1967 | Canada | 96—115 |
| 945,673 | 7/1956 | Germany | 96—33 |
| 695,197 | 8/1953 | Great Britain | 96—115 |
| 741,294 | 11/1955 | Great Britain | 96—115 |

WILLIAM D. MARTIN, Primary Examiner

M. R. P. PERRONE, JR., Assistant Examiner

U.S. Cl. X.R.

96—87 R, 89, 115 P

PO-1050
(5/69)

UNITED STATES PATENT OFFICE
CERTIFICATE OF CORRECTION

Patent No. 3,625,696 Dated December 7, 1971

Inventor(s) Carl Heinrich Krauch and Hans-Werner Otto

It is certified that error appears in the above-identified patent and that said Letters Patent are hereby corrected as shown below:

Column 5, line 19, "35" should read -- 55 --.

Column 6, line 45, "bis-N-methlolacrylamide" should read -- bis-N-methylolacrylamide --.

Column 7, line 27, claim 3, "mers" should read -- mer --.

Signed and sealed this 9th day of May 1972.

(SEAL)
Attest:

EDWARD M.FLETCHER,JR.
Attesting Officer

ROBERT GOTTSCHALK
Commissioner of Patents